US008953334B2

(12) United States Patent
Lin et al.

(10) Patent No.: US 8,953,334 B2
(45) Date of Patent: Feb. 10, 2015

(54) APPARATUS FOR PERFORMING COMMUNICATION CONTROL

(75) Inventors: Yu-Te Lin, New Taipei (TW); Hsiao-Tung Lin, New Taipei (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 496 days.

(21) Appl. No.: 13/360,807

(22) Filed: Jan. 30, 2012

(65) Prior Publication Data

US 2013/0194758 A1 Aug. 1, 2013

(51) Int. Cl.
*H05K 7/00* (2006.01)

(52) U.S. Cl.
USPC .......... 361/760; 361/18; 340/521; 340/635; 257/296; 257/531; 257/532; 438/118; 438/458

(58) Field of Classification Search
USPC .......... 361/760, 18; 340/521, 635; 257/296, 257/531, 532; 438/118, 458
See application file for complete search history.

(56) References Cited

U.S. PATENT DOCUMENTS

| 6,444,922 | B1 | 9/2002 | Kwong | |
|---|---|---|---|---|
| 2005/0051870 | A1* | 3/2005 | Yamazaki et al. | 257/531 |
| 2007/0008663 | A1* | 1/2007 | Nakashima et al. | 361/18 |
| 2007/0275506 | A1* | 11/2007 | Yamazaki et al. | 438/118 |
| 2009/0055820 | A1 | 2/2009 | Huang | |
| 2009/0309745 | A1* | 12/2009 | Johnson | 340/635 |
| 2012/0075005 | A1 | 3/2012 | Flores | |

FOREIGN PATENT DOCUMENTS

| CN | 1534432 A | 10/2004 |
|---|---|---|
| CN | 1929132 A | 3/2007 |
| EP | 2 129 194 A1 | 12/2009 |

* cited by examiner

*Primary Examiner* — Xiaoliang Chen
(74) *Attorney, Agent, or Firm* — Winston Hsu; Scott Margo (57) ABSTRACT

An apparatus for performing communication control includes a control module implemented with at least one integrated circuit (IC) whose package includes a plurality of sets of terminals, each set of the plurality of sets of terminals corresponding to one of a plurality of sub-modules of the control module, and within the sets of terminals, a set of terminals corresponding to a specific sub-module of the sub-modules include a power-input terminal arranged to input power from outside the control module. For example, on a printed circuit board (PCB) of the apparatus, arrangement of some modules is similar to that of some contact pads associated to the sets of terminals. In another example, the control module includes a power distribution system including at least one power distribution wire. In another example, a PCB within the apparatus includes at least one signal transmission wire and at least one set of co-plane ground wires.

7 Claims, 8 Drawing Sheets

APPARATUS FOR PERFORMING COMMUNICATION CONTROL

BACKGROUND

The present invention relates to circuit arrangement of an electronic device, and more particularly, to apparatus for performing communication control.

According to the related art, a portable electronic device equipped with a touch screen (e.g., a multifunctional mobile phone, a personal digital assistant (PDA), a tablet, etc) is very useful for an end user. Typically, it can be utilized for making a phone call or displaying a document or a message to be read by the end user. In a situation where reducing costs is required, some problems may occur. For example, utilizing some low cost materials/components may become a must during implementing a product of a lower price in a target market, causing the performance to be unacceptable. In another example, some manufacturers may suffer from the tradeoff between the performance and the material/component costs, causing the schedule of a new product to be delayed. In conclusion, the related art does not serve the end user well.

SUMMARY

It is therefore an objective of the claimed invention to provide apparatus for performing communication control, in order to solve the above-mentioned problems.

It is another objective of the claimed invention to provide apparatus for performing communication control, in order to provide the end user with a product of a lower price without severely degrading the overall performance thereof.

An exemplary embodiment of an apparatus for performing communication control is provided, where the apparatus comprises at least one portion of an electronic device. The apparatus comprises a control module and an ancillary circuit. The control module is implemented with at least one integrated circuit (IC) whose package comprises a plurality of sets of terminals, each set of the plurality of sets of terminals corresponding to one of a plurality of sub-modules of the control module. In addition, the sub-modules comprise a first sub-module group and further comprise a second sub-module group. The first sub-module group comprises a power management unit (PMU), and the second sub-module group comprises a memory control sub-module and a liquid crystal display module (LCM) control sub-module, wherein a power-input terminal of a set of terminals corresponding to the PMU is arranged to input power from outside the control module. Additionally, the ancillary circuit is implemented with a printed circuit board (PCB). The PCB comprises a plurality of contact pads arranged within a contact pad area on the PCB, and the contact pad area includes a plurality of sub-areas respectively corresponding to the sets of terminals, wherein within the plurality of contact pads, those arranged within one of the sub-areas are utilized for electrically connecting one set of the sets of terminals to the ancillary circuit. In particular, the ancillary circuit comprises a plurality of modules, which comprise a first module group and a second module group. The first module group is positioned at a first side/corner of the PCB, and is arranged to perform operations for the first sub-module group, wherein within the contact pad area, contact pads that are electrically connected to the first module group are positioned at a same side/corner as the first side/corner. The second module group is positioned at a second side/corner of the PCB, and is arranged to perform operations for the second sub-module group, wherein within the contact pad area, contact pads that are electrically connected to the second module group are positioned at a same side/corner as the second side/corner.

An exemplary embodiment of an apparatus for performing communication control is provided, where the apparatus comprises at least one portion of an electronic device. The apparatus comprises a control module implemented with at least one IC whose package comprises a plurality of sets of terminals, each set of the plurality of sets of terminals corresponding to one of a plurality of sub-modules of the control module, wherein within the sets of terminals, a set of terminals corresponding to a specific sub-module of the sub-modules comprise a power-input terminal arranged to input power from outside the control module. In addition, and the control module comprises a power distribution system comprising at least one power distribution wire, wherein the power distribution system is arranged to distribute the power to the specific sub-module and at least one other sub-module of the sub-modules, and the at least one power distribution wire is electrically connected to the power-input terminal. In particular, the apparatus further comprises an ancillary circuit implemented with a PCB. The PCB comprises a plurality of contact pads arranged within a contact pad area on the PCB, and the contact pad area includes a plurality of sub-areas respectively corresponding to the sets of terminals, wherein within the plurality of contact pads, those arranged within one of the sub-areas are utilized for electrically connecting one set of the sets of terminals to the ancillary circuit. For example, the PCB can be a two-layer PCB.

An exemplary embodiment of an apparatus for performing communication control is provided, where the apparatus comprises at least one portion of an electronic device. The apparatus comprises a control module and an ancillary circuit. The control module is implemented with at least one IC whose package comprises a plurality of sets of terminals, each set of the plurality of sets of terminals corresponding to one of a plurality of sub-modules of the control module, wherein the sub-modules comprise a radio frequency (RF) control sub-module arranged to perform RF control operations. In addition, the ancillary circuit is implemented with a PCB. The PCB comprises a plurality of contact pads arranged within a contact pad area on the PCB, and the contact pad area includes a plurality of sub-areas respectively corresponding to the sets of terminals, wherein within the plurality of contact pads, those arranged within one of the sub-areas are utilized for electrically connecting one set of the sets of terminals to the ancillary circuit. Additionally, the ancillary circuit comprises an RF module arranged to generate an RF signal under control of the RF control sub-module, wherein the PCB comprises at least one signal transmission wire arranged to transmit the RF signal, and further comprises at least one set of co-plane ground wires corresponding to the at least one signal transmission wire, and the set of co-plane ground wires are positioned beside the signal transmission wire and are positioned in a same layer as that of the signal transmission wire. For example, a thickness of the PCB is greater than a distance between the signal transmission wire and any of the set of co-plane ground wires. In particular, the PCB is a two-layer PCB, whose two layers are respectively positioned on opposite planes on the PCB, and the signal transmission wire and the set of co-plane ground wires are in one of the two layers.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in sub-module. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
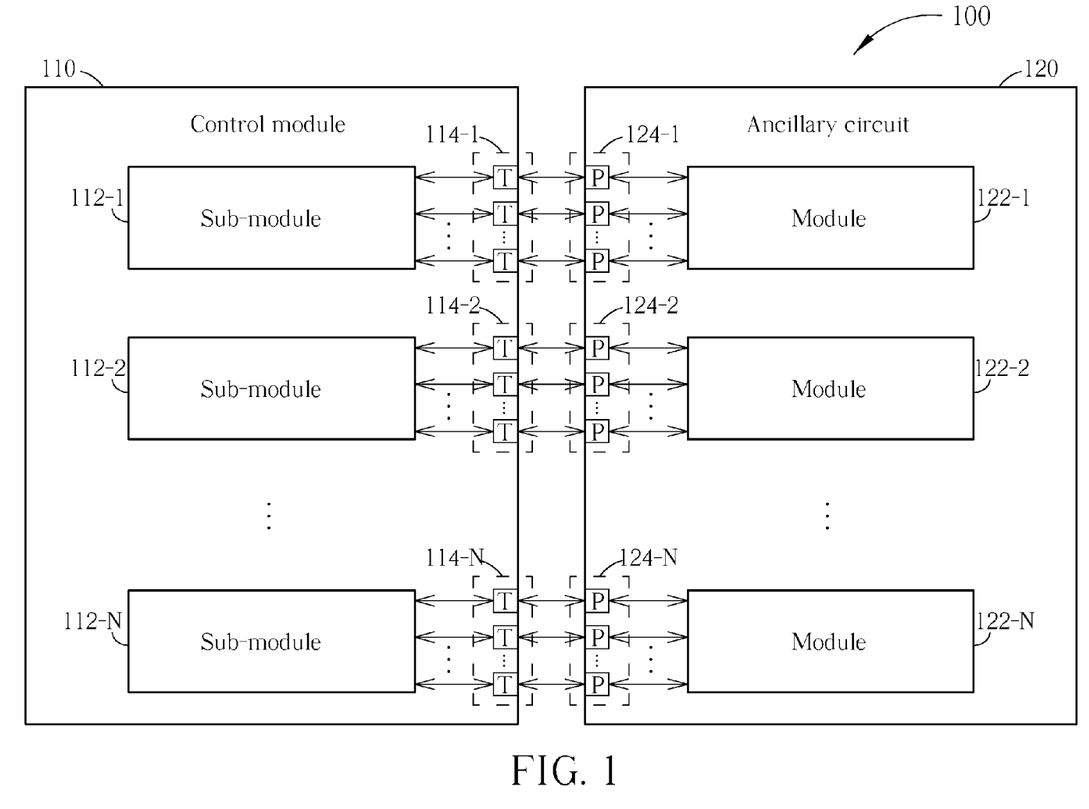
FIG. 1 is a diagram of an apparatus for performing communication control according to a first embodiment of the present invention.

Please refer to FIG. 1, which illustrates a diagram of an apparatus 100 for performing communication control according to a first embodiment of the present invention. According to different embodiments, such as the first embodiment and some variations thereof, the apparatus 100 may comprise at least one portion (e.g. a portion or all) of an electronic device. For example, the apparatus 100 may comprise a portion of the electronic device mentioned above, and more particularly, can be a control circuit such as an integrated circuit (IC) within the electronic device. In another example, the apparatus 100 can be the whole of the electronic device mentioned above. In another example, the apparatus 100 can be an audio/video system comprising the electronic device mentioned above. Examples of the electronic device may include, but not limited to, a mobile phone (e.g. a multifunctional mobile phone), a personal digital assistant (PDA), a portable electronic device such as the so-called tablet (based on a generalized definition), and a personal computer such as a tablet personal computer (which can also be referred to as the tablet, for simplicity), a laptop computer, or desktop computer.

As shown in FIG. 1, the apparatus 100 comprises a control module 110 and an ancillary circuit 120. According to this embodiment, the control module 110 is implemented with at least one IC whose package comprises a plurality of sets of terminals (labeled "T" in FIG. 1), such as N sets of terminals 114-1, 114-2, . . . , and 114-N, where N can be an integer that is greater than one. Each set of the plurality of sets of terminals, such as the set of terminals 114-*n*, with n being an integer falling within a range of the interval [1, N], are corresponding to one of a plurality of sub-modules 112-1, 112-2, . . . , and 112-N of the control module 110, and more particularly, are corresponding to the sub-module 112-*n*. In addition, the sub-modules 112-1, 112-2, . . . , and 112-N comprise a first sub-module group comprising at least one sub-module (e.g. one or more sub-modules, such as the sub-modules 112-1 and 112-2) and further comprise a second sub-module group comprising at least one sub-module (e.g. one or more sub-modules, such as the sub-modules 112-3, 112-4, and 112-5). For example, the first sub-module group may comprise a radio frequency (RF) control sub-module and a power management unit (PMU) (which can be the sub-modules 112-1 and 112-2 in this embodiment, respectively), and the second sub-module group may comprise a memory control sub-module, a subscriber identity module (SIM) control sub-module, and a liquid crystal display module (LCM) control sub-module (which can be the sub-modules 112-3, 112-4, and 112-4 in this embodiment, respectively). Please note that the RF control sub-module is arranged to perform RF control operations, and the SIM control sub-module is arranged to perform SIM control operations. In practice, a power-input terminal of a set of terminals corresponding to the PMU can be arranged to input power from outside the control module 110, and more particularly, from a battery.

Figure 2:
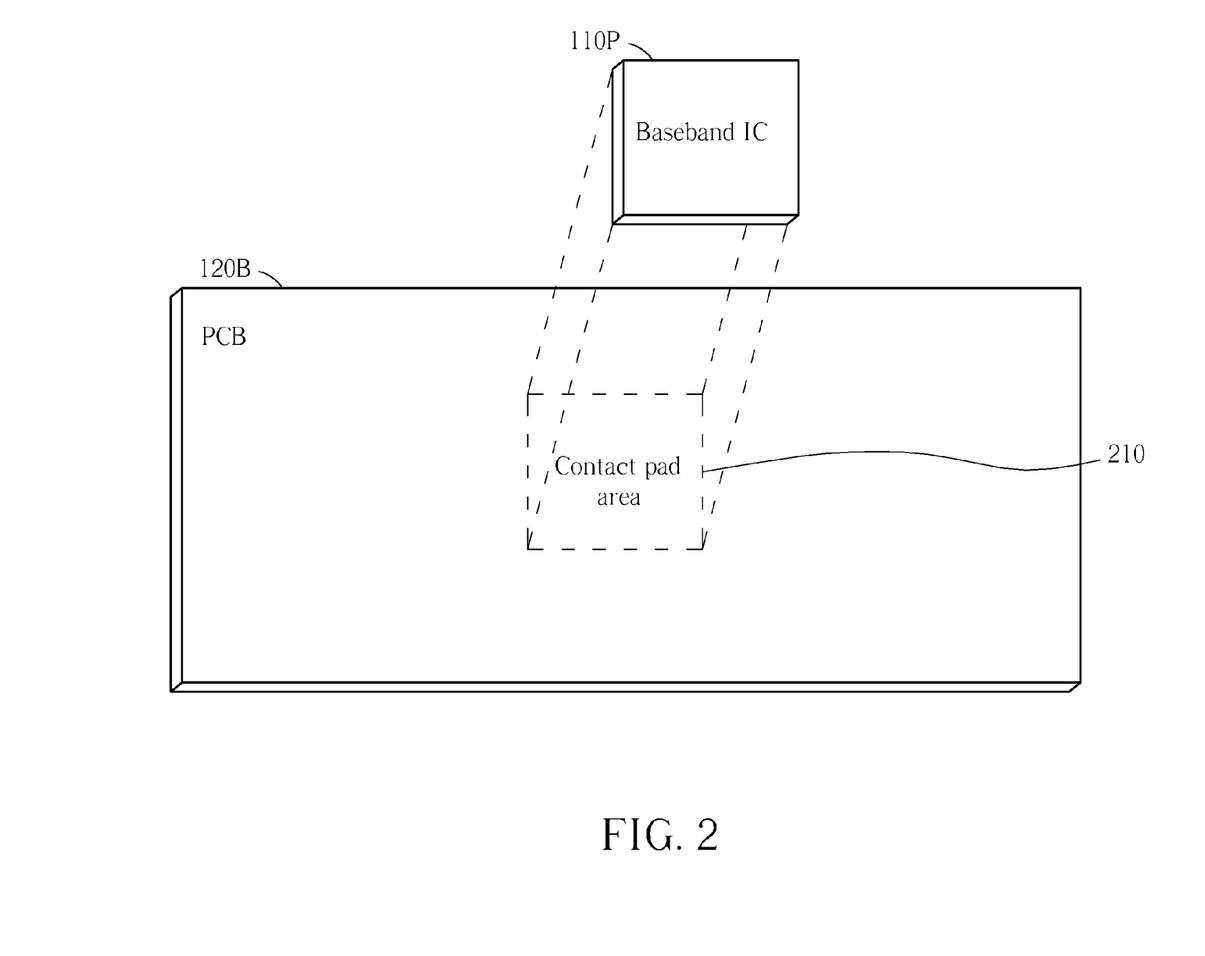
FIG. 2 illustrates a package of at least one integrated circuit (IC) for implementing the control module shown in FIG. 1 and a printed circuit board (PCB) for implementing the ancillary circuit shown in FIG. 1 according to an embodiment of the present invention.

According to an embodiment, such as the embodiment shown in FIG. 2, the ancillary circuit 120 can be implemented with a printed circuit board (PCB) 120B, where the notation 110P can be utilized for representing the package mentioned above. In this embodiment, the aforementioned at least one IC can be a baseband IC, and therefore, the package 110P of this embodiment is labeled "Baseband IC". Please refer to FIG. 1 and FIG. 2 at the same time. The PCB 120B comprises a plurality of contact pads (labeled "P" in FIG. 1) arranged within a contact pad area 210 on the PCB 120B, such as N sets of contact pads 124-1, 124-2, . . . , and 124-N, and the contact pad area 210 includes a plurality of sub-areas r(1), r(2), . . . , and r(N) respectively corresponding to the sets of terminals 114-1, 114-2, . . . , and 114-N, where within the plurality of contact pads (labeled "P" in FIG. 1), those arranged within one of the sub-areas r(1), r(2), . . . , and r(N), such as the set of contact pads 124-*n* arranged within the sub-area r(n), are utilized for electrically connecting one set of the sets of terminals 114-1, 114-2, . . . , and 114-N (more particularly, the set of terminals 114-*n*) to the ancillary circuit 120. In particular, the ancillary circuit 120 comprises a plurality of modules 122-1, 122-2, . . . , and 122-N, which may comprise a first module group comprising at least one module (e.g. one or more modules, such as the modules 122-1 and 122-2) and a second module group comprising at least one module (e.g. one or more modules, such as the modules 122-3, 122-4, and 122-5).

Please note that the first module group is positioned at a first side/corner of the PCB 120B, and is arranged to perform operations for the first sub-module group, where within the contact pad area 210, contact pads that are electrically connected to the first module group are positioned at the same side/corner as the first side/corner. In addition, the second module group is positioned at a second side/corner of the PCB 120B, and is arranged to perform operations for the second sub-module group, where within the contact pad area 210, contact pads that are electrically connected to the second module group are positioned at the same side/corner as the second side/corner. For example, the first sub-module group such as the sub-modules 112-1 and 112-2 may represent the RF control sub-module and the PMU, respectively, and the second sub-module group such as the sub-modules 112-3, 112-4, and 112-4 may represent the memory control sub-module, the SIM control sub-module, and the LCM control sub-module, respectively. Thus, the first module group such as the modules 122-1 and 122-2 may represent an RF module and an external capacitor of the PMU, respectively, and the second module group such as the modules 122-3, 122-4, and 122-5 may represent a memory, a SIM loader, and an LCM, respectively. Please note that the RF module is arranged to generate an RF signal under control of the RF control sub-module. In addition, the memory is arranged to temporarily store information, where the memory is controlled by the memory control sub-module. Additionally, the SIM loader is arranged to load a SIM card, and the LCM is arranged to display information, where the LCM is controlled by the LCM control sub-module.

In practice, the PCB 120B can be a two-layer PCB. In a situation where the PCB 120B is the aforementioned two-layer PCB, the arrangement disclosed above (more particularly, the similarity between the arrangement of the sub-module group and the arrangement of the module group) is helpful on reducing associated costs, allowing the end user to have a product of a lower price.

Figure 3:
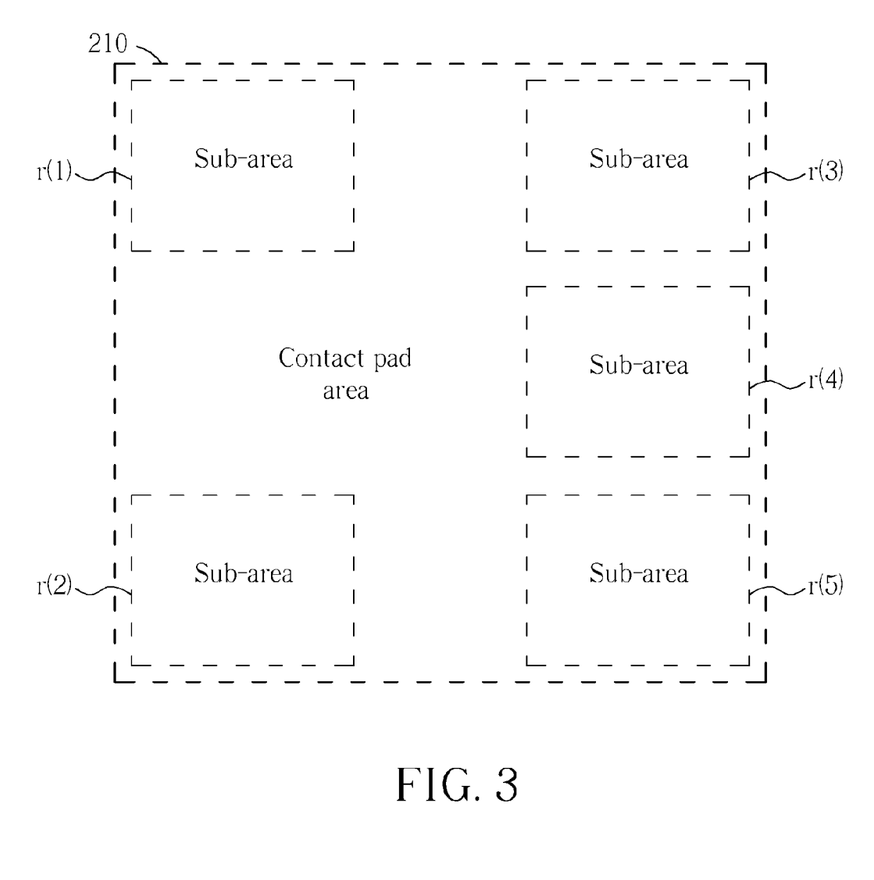
FIG. 3 illustrates exemplary arrangement of some sub-areas of the contact pad area shown in FIG. 2 according to an embodiment of the present invention.
Figure 4:
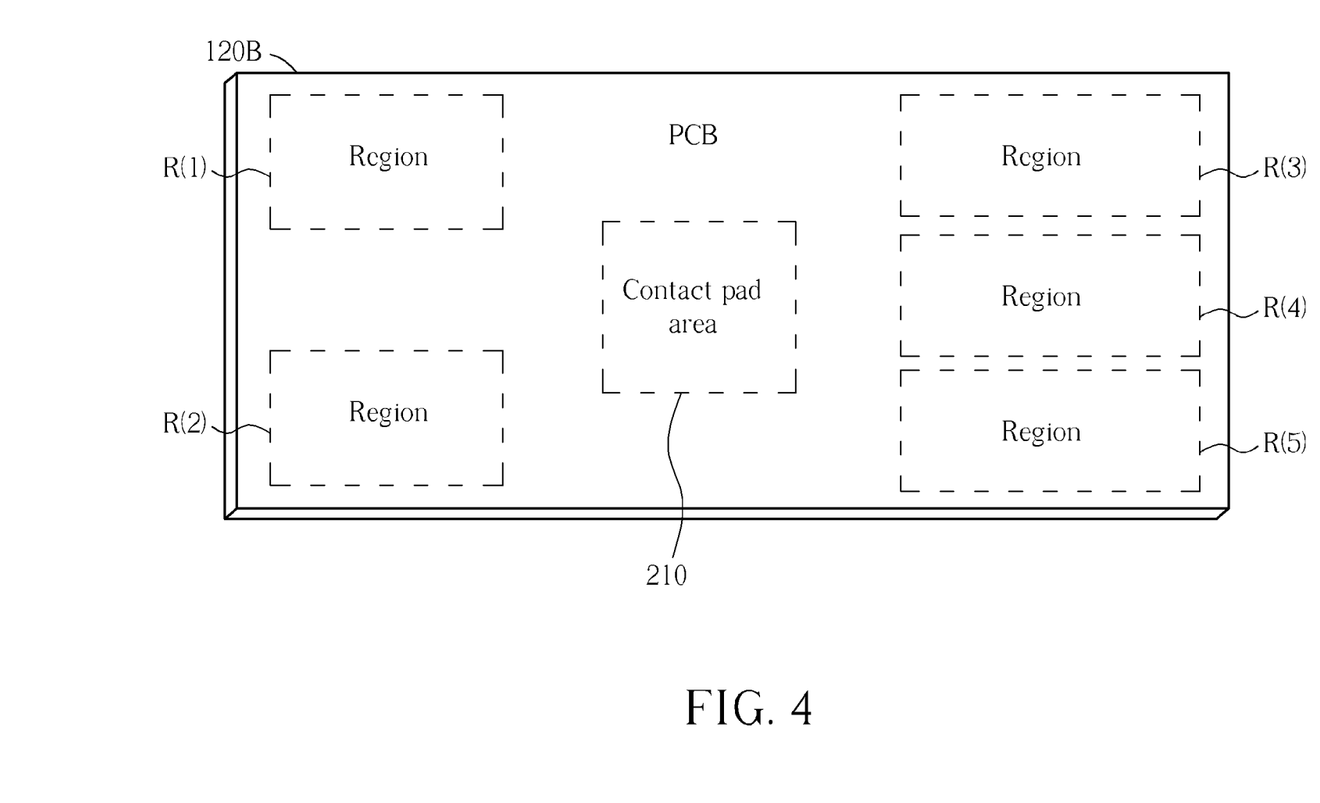
FIG. 4 illustrates exemplary arrangement of some modules of the ancillary circuit shown in FIG. 1 according to the embodiment shown in FIG. 3.

FIG. 3 illustrates exemplary arrangement of some sub-areas r(1), r(2), r(3), r(4), and r(5) of the contact pad area 210 shown in FIG. 2 according to an embodiment of the present invention, and FIG. 4 illustrates exemplary arrangement of some regions R(1), R(2), R(3), R(4), and R(5) for positioning some modules of the ancillary circuit 120 shown in FIG. 1, such as the modules 122-1, 122-2, 122-3, 122-4, and 122-5, according to the embodiment shown in FIG. 3.

The sub-areas r(1) and r(2) are positioned on the left side of the contact pad area 210 shown in FIG. 3, while the associated regions R(1) and R(2) are positioned on the left side of the PCB 120B shown in FIG. 4. More particularly, the sub-areas r(1) and r(2) within the contact pad area 210 and the associated regions R(1) and R(2) within the PCB 120B correspond to the same arrangement, respectively, where both the sub-area r(1) and the associated region R(1) are positioned around the upper left corner, and both the sub-area r(2) and the associated region R(2) are positioned around the lower left corner.

In addition, the sub-areas r(3), r(4), and r(5) are positioned on the right side of the contact pad area 210 shown in FIG. 3, while the associated regions R(3), R(4), and R(5) are positioned on the right side of the PCB 120B shown in FIG. 4. More particularly, the sub-areas r(3), r(4), and r(5) within the contact pad area 210 and the associated regions R(3), R(4), and R(5) within the PCB 120B correspond to the same arrangement, respectively, where both the sub-area r(3) and the associated region R(3) are positioned around the upper right corner, and both the sub-area r(5) and the associated region R(5) are positioned around the lower right corner.

According to this embodiment, the first sub-module group such as the sub-modules 112-1 and 112-2 may represent the RF control sub-module and the PMU, respectively, and the second sub-module group such as the sub-modules 112-3, 112-4, and 112-4 may represent the memory control sub-module, the SIM control sub-module, and the LCM control sub-module, respectively. In addition, the first module group such as the modules 122-1 and 122-2 may represent the RF module and the external capacitor of the PMU, respectively, and the second module group such as the modules 122-3, 122-4, and 122-5 may represent the memory, the SIM loader, and the LCM, respectively. Thus, different groups of modules are positioned at different sides/corners of the PCB 120B, and the associated sets of contact pads respectively corresponding to different groups of sub-modules are positioned at different sides/corners of the contact pad area 210. Therefore, interference can be prevented while reducing the size of the PCB 120B, which is helpful on providing the end user with a product of a lower price.

Figure 5:
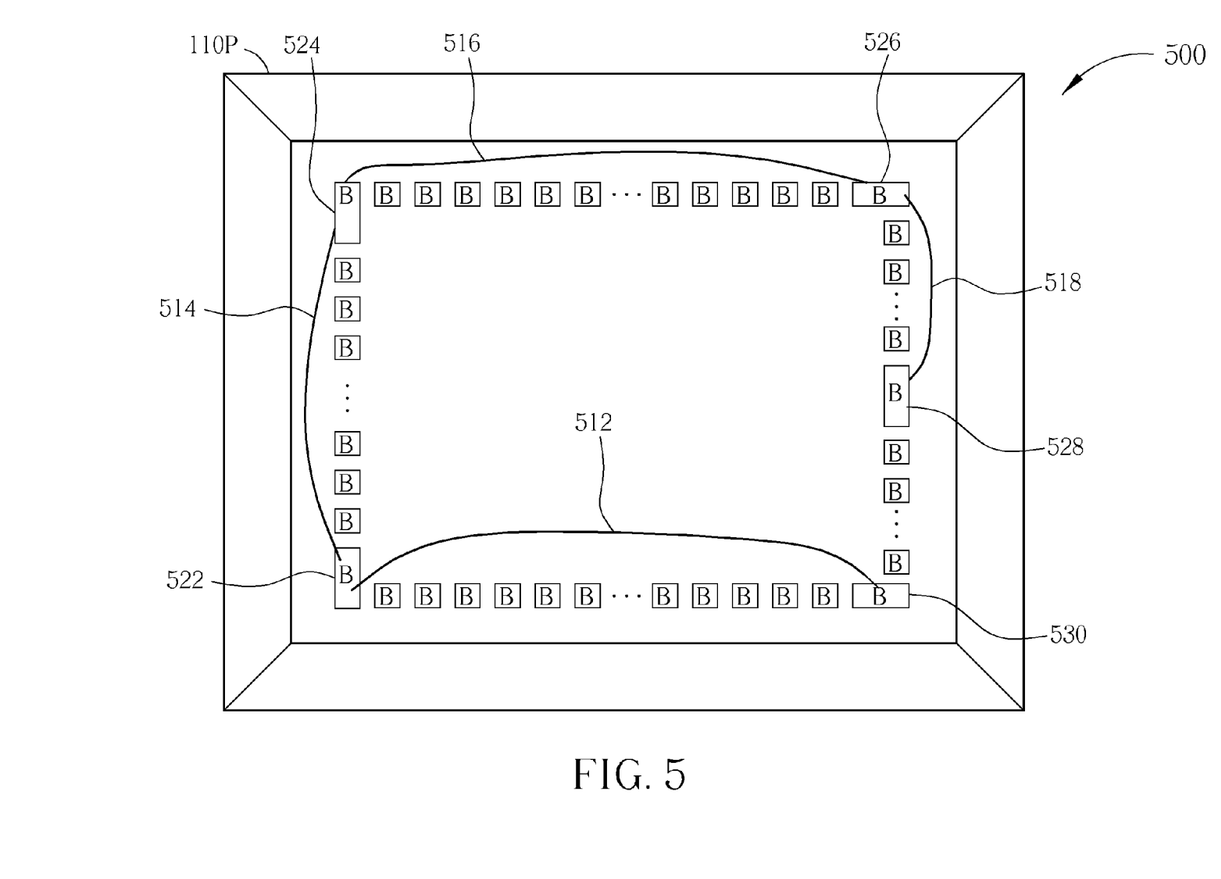
FIG. 5 illustrates a power distribution system comprising at least one power distribution wire within the package shown in FIG. 2 according to an embodiment of the present invention.

FIG. 5 illustrates a power distribution system 500 comprising at least one power distribution wire, such as a plurality of power distribution wires 512, 514, 516, and 518, within the package 110P shown in FIG. 2 according to an embodiment of the present invention, where the control module 110 comprises the power distribution system 500.

According to this embodiment, within the sets of terminals 114-1, 114-2, ..., and 114-N, a set of terminals corresponding to a specific sub-module of the sub-modules comprise a power-input terminal arranged to input power from outside the control module 110, where the power distribution system 500 is arranged to distribute the power (more particularly, the power that is input by utilizing the power-input terminal) to the specific sub-module and at least one other sub-module of the sub-modules 112-1, 112-2, ..., and 112-N. For example, the specific sub-module can be the PMU mentioned above. In another example, the specific sub-module can be another sub-module. Please note that the aforementioned at least one power distribution wire is electrically connected to the power-input terminal mentioned above. In practice, the power distribution system 500 may further comprise a portion of a plurality of bonding pads (labeled B in this embodiment) within the package 110P, and more particularly, some enlarged bonding pads such as the bonding pads 522, 524, 526, 528, and 530.

According to this embodiment, the aforementioned at least one power distribution wire is positioned outside the aforementioned at least one IC, and is positioned within the package 110P. For example, the aforementioned at least one power distribution wire such as the power distribution wires 512, 514, 516, and 518 can be implemented with wire bonding. This is for illustrative purposes only, and is not meant to be a limitation of the present invention. According to some variations of this embodiment, at least one portion of the aforementioned at least one power distribution wire is positioned within the aforementioned at least one IC. For example, the aforementioned at least one power distribution wire can be implemented with a semiconductor process applied to the aforementioned at least one IC.

No matter whether the aforementioned at least one power distribution wire is implemented with wire bonding or is implemented with the semiconductor process applied to the aforementioned at least one IC, the PCB 120B can be a two-layer PCB such as that mentioned above. In a situation where the PCB 120B is the aforementioned two-layer PCB, the power distribution system 500 (more particularly, the aforementioned at least one power distribution wire) is helpful on reducing the complexity and the size of the PCB 120B and reducing associated costs, allowing the end user to have a product of a lower price.

Figure 6:
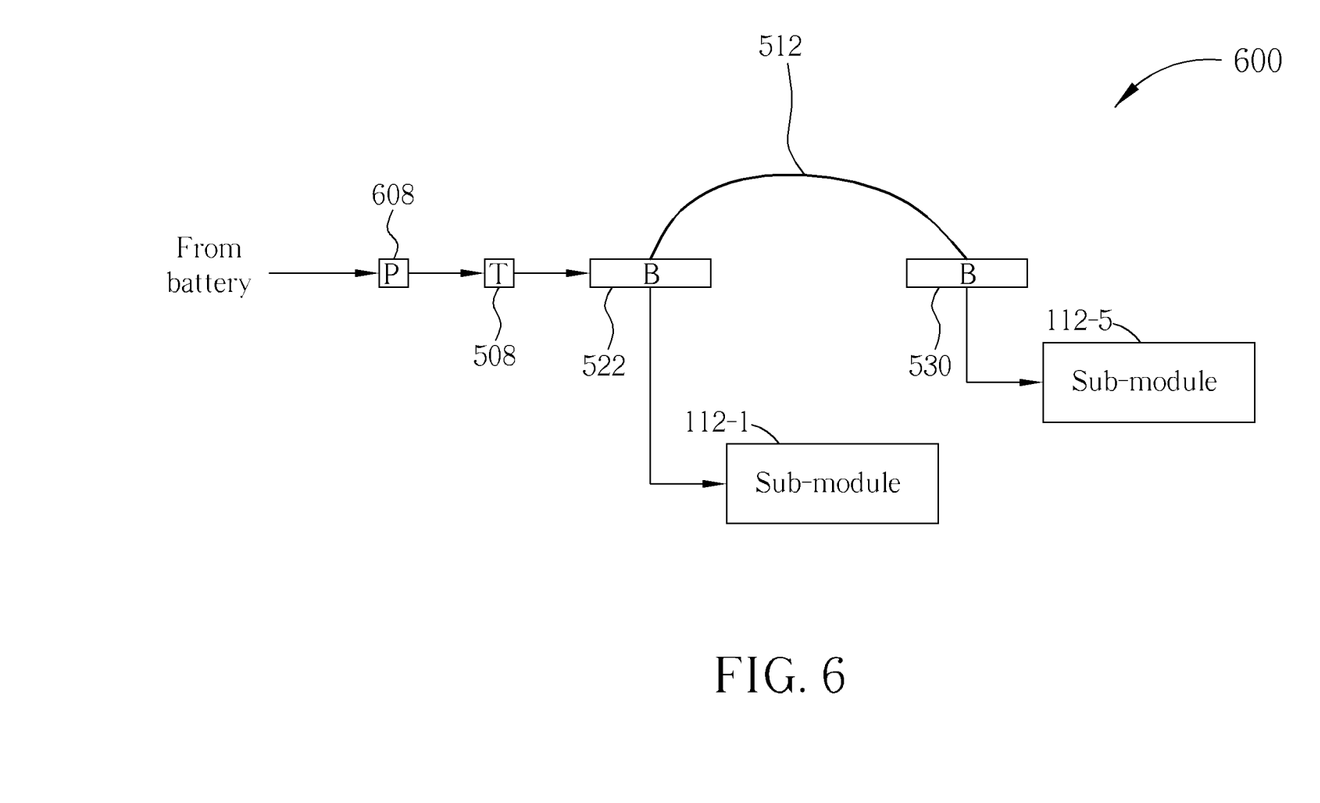
FIG. 6 illustrates some exemplary power-input paths passing through one or more bonding pads shown in FIG. 5 according to an embodiment of the present invention.

FIG. 6 illustrates some exemplary power-input paths 600 passing through one or more bonding pads shown in FIG. 5 (e.g. the bonding pad 522, or the bonding pads 522 and 530) according to an embodiment of the present invention, where the numeral 508 is utilized for representing the aforementioned power-input terminal, which is labeled "T" in this embodiment.

According to this embodiment, the aforementioned contact pads (labeled "P" in FIG. 1) comprise a power-input contact pad 608 (labeled "P" in FIG. 6), which is positioned within a specific sub-area of the sub-areas, and is arranged to electrically connect the power-input terminal 508 to the ancillary circuit 120. As shown in FIG. 6, a power-input path may start from a battery such as that mentioned above, and pass through the power-input contact pad 608, the power-input terminal 508, and the bonding pad 522 and enter the specific sub-module mentioned above, where the sub-module 112-1 is taken as an example of the specific sub-module in this embodiment. In addition, another power-input path may start from the battery, and pass through the power-input contact pad 608, the power-input terminal 508, the bonding pad 522, the power distribution wire 512, and the bonding pad 530 and enter the another sub-module such as the sub-module 112-5 in this embodiment.

According to some embodiments, such as some variations of the embodiment shown in FIG. 6, the power-input contact pad 608 is not electrically connected to any non-dummy contact pad within an sub-area corresponding to a set of terminals corresponding to the aforementioned at least one other sub-module in the embodiment shown in FIG. 5, which means the aforementioned power that is input by utilizing the power-input terminal 508 is not shared by any non-dummy contact pad within the sub-area corresponding to the set of terminals corresponding to the aforementioned at least one other sub-module. For example, the non-dummy contact pad mentioned above is arranged to electrically connect a non-dummy terminal of the sets of terminals to the ancillary circuit 120, and the non-dummy terminal is within the set of terminals corresponding to the aforementioned at least one other sub-module.

Figure 7:
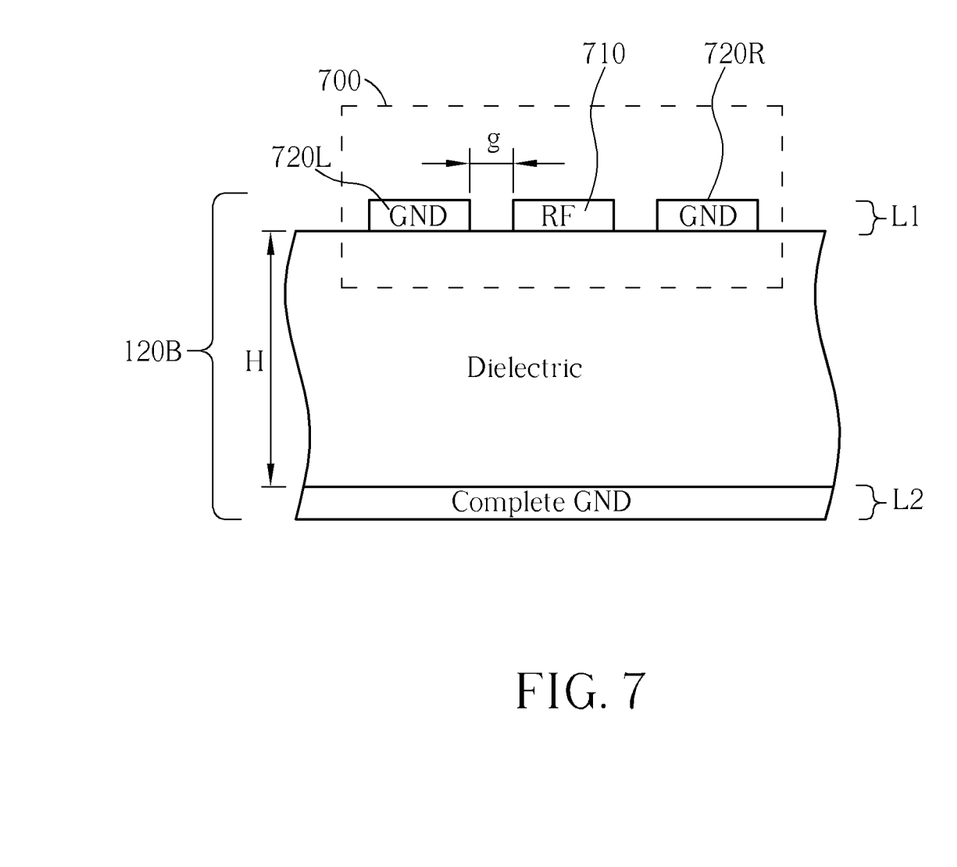
FIG. 7 illustrates a co-plane ground system of the PCB shown in FIG. 2 according to an embodiment of the present invention.

FIG. 7 illustrates a co-plane ground system 700 of the PCB 120B shown in FIG. 2 according to an embodiment of the present invention. For example, the sub-modules 112-1, 112-2, . . . , and 112-N comprise the RF control sub-module mentioned above, and the ancillary circuit 120 comprises the RF module mentioned above.

According to this embodiment, the PCB 120B is a two-layer PCB such as that disclosed above. More particularly, the PCB 120B, whose two layers L1 and L2 are respectively positioned on opposite planes on the PCB 120B, comprises at least one signal transmission wire 710 (labeled "RF" in FIG. 7) arranged to transmit the RF signal, and further comprises at least one set of co-plane ground wires 720L and 720R (labeled "GND" in FIG. 7) corresponding to the aforementioned at least one signal transmission wire 710. In addition, the set of co-plane ground wires 720L and 720R are positioned beside the signal transmission wire 710 and are positioned in the same layer as that of the signal transmission wire. As shown in FIG. 7, the signal transmission wire 710 and the set of co-plane ground wires 720L and 720R are in one of the two layers L1 and L2, and more particularly, the layer L1 in this embodiment.

In practice, the thickness of the PCB 120B, and more particularly, the thickness H of the dielectric of the PCB 120B, is greater than the distance between the signal transmission wire 710 and any of the set of co-plane ground wires 720L and 720R. For example, the thickness H of the PCB 120B is greater than the distance g between the signal transmission wire 710 and the co-plane ground wire 720L. Please note that the PCB 120B comprises a complete ground (labeled "Complete GND") in the layer L2. Although the complete ground may have a larger area than that of any of the co-plane ground wires 720L and 720R, implementing the apparatus 100 by utilizing the co-plane ground system 700 shown in FIG. 7 can achieve better performance since the distance between the signal transmission wire 710 and any of the set of co-plane ground wires 720L and 720R (e.g. the distance g shown in FIG. 7) can be much less than the thickness H, which can be considered to be the distance between the two layers L1 and L2). In a situation where the thickness H is equal to 1 millimeter (mm), for example, the performance of the apparatus 100 can be greatly enhanced when the co-plane ground system 700 shown in FIG. 7 is utilized.

Figure 8:
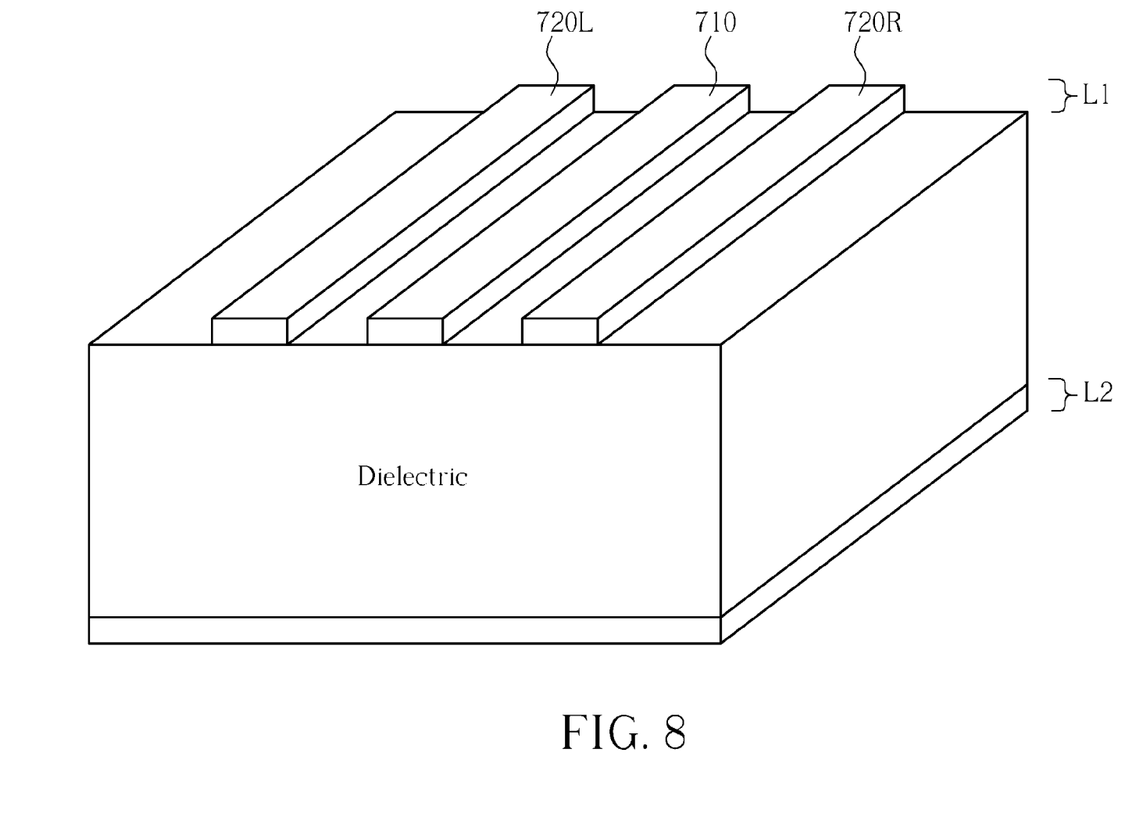
FIG. 8 illustrates an exemplary arrangement of the signal transmission wire and the co-plane ground wires shown in FIG. 7 according to an embodiment of the present invention.

FIG. 8 illustrates an exemplary arrangement of the signal transmission wire 710 and the co-plane ground wires 720L and 720R shown in FIG. 7 according to an embodiment of the present invention. According to this embodiment, the co-plane ground wire 720L and the co-plane ground wire 720R are positioned at different sides of the signal transmission wire 710, where an edge of at least one portion of the set of co-plane ground wires 720L and 720R is parallel to an edge of at least one portion of the signal transmission wire 710.

It is an advantage of the present invention that, in a situation where associated costs are reduced for implementing an electronic device (e.g. a two layer PCB is utilized), the present invention apparatus can achieve better performance in comparison with the related art. In addition, implementing the apparatus 100 based upon any of the embodiments/variations disclosed above allows associated costs to be greatly reduced without introducing any of the related art problems.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An apparatus for performing communication control, the apparatus comprising at least one portion of an electronic device, the apparatus comprising:
   a control module implemented with at least one integrated circuit (IC) whose package comprises a plurality of sets of terminals, each set of the plurality of sets of terminals corresponding to one of a plurality of sub-modules of the control module, wherein the sub-modules comprise:
      a first sub-module group, which comprises a power management unit (PMU), wherein a power-input terminal of a set of terminals corresponding to the PMU is arranged to input power from outside the control module; and
      a second sub-module group, which comprises a memory control sub-module and a liquid crystal display module (LCM) control sub-module; and
   an ancillary circuit implemented with a printed circuit board (PCB), the PCB comprising a plurality of contact pads arranged within a contact pad area on the PCB, the contact pad area including a plurality of sub-areas respectively corresponding to the sets of terminals, wherein within the plurality of contact pads, those arranged within one of the sub-areas are utilized for electrically connecting one set of the sets of terminals to the ancillary circuit, and the ancillary circuit comprises a plurality of modules comprising:
      a first module group, positioned at a first side/corner of the PCB, arranged to perform operations for the first sub-module group, wherein within the contact pad area, contact pads that are electrically connected to the first module group are positioned at a same side/corner as the first side/corner; and
      a second module group, positioned at a second side/corner of the PCB, arranged to perform operations for the second sub-module group, wherein within the contact pad area, contact pads that are electrically connected to the second module group are positioned at a same side/corner as the second side/corner.

2. The apparatus of claim 1, wherein the first module group comprises an external capacitor of the PMU; and the second module group comprises:
   a memory arranged to temporarily store information, wherein the memory is controlled by the memory control sub-module; and
   an LCM arranged to display information, wherein the LCM is controlled by the LCM control sub-module.

3. The apparatus of claim 2, wherein the first sub-module group further comprises a radio frequency (RF) control sub-module arranged to perform RF control operations; and the first module group further comprises an RF module arranged to generate an RF signal under control of the RF control sub-module.

4. The apparatus of claim 2, wherein the second sub-module group further comprises a subscriber identity module (SIM) control sub-module arranged to perform SIM control operations; and the second module group further comprises a SIM loader arranged to load a SIM card.

5. The apparatus of claim 1, wherein the first sub-module group further comprises a radio frequency (RF) control sub-module arranged to perform RF control operations.

6. The apparatus of claim 1, wherein the second sub-module group further comprises a subscriber identity module (SIM) control sub-module arranged to perform SIM control operations.

7. The apparatus of claim 1, wherein the PCB is a two-layer PCB.

\* \* \* \* \*